US012603261B2

(12) United States Patent
    Hankes

(10) Patent No.: US 12,603,261 B2
(45) Date of Patent: Apr. 14, 2026

(54) ALIGNER STATION WITH LIFTING MECHANISM

(71) Applicant: Applied Materials, Inc., Santa Clara, CA (US)

(72) Inventor: Michael Carl Hankes, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 198 days.

(21) Appl. No.: 18/627,038

(22) Filed: Apr. 4, 2024

(65) Prior Publication Data

US 2025/0316463 A1     Oct. 9, 2025

(51) Int. Cl.
    *B25J 11/00*       (2006.01)
    *H01J 37/244*      (2006.01)
    *H01J 37/32*       (2006.01)
(52) U.S. Cl.
    CPC ..... *H01J 37/32807* (2013.01); *B25J 11/0095* (2013.01); *H01J 37/244* (2013.01); *H01J 37/32889* (2013.01); *H01J 37/32642* (2013.01); *H01J 2237/24578* (2013.01)
(58) Field of Classification Search
    CPC ............... H01J 37/32807; H01J 37/244; H01J 37/32889; H01J 37/32642
    See application file for complete search history.

(56) References Cited

U.S. PATENT DOCUMENTS

2020/0013657 A1   1/2020  Lee et al.
2021/0057256 A1*  2/2021  Bergantz ........... H01L 21/67201
2021/0217650 A1*  7/2021  Volfovski ............ H01L 21/6838
2022/0059384 A1   2/2022  Yoshino et al.
2023/0047039 A1*  2/2023  Genetti ............. H01L 21/67763

OTHER PUBLICATIONS

International Search Report and Written Opinion for International Application No. PCT/US2025/023020, mailed Jul. 22, 2025, 10 Pages.

* cited by examiner

*Primary Examiner* — Jason L Vaughan
*Assistant Examiner* — Amanda Kreiling
(74) *Attorney, Agent, or Firm* — Lowenstein Sandler LLP

(57)     ABSTRACT

An aligner station includes an aligner stage configured to support a carrier of a process kit ring. The aligner stage is configured to rotate to correct an alignment of the carrier and of the process kit ring supported by the carrier relative to a target orientation. The aligner station further includes a lift mechanism configured to lift the process kit ring from the carrier. The aligner stage is further configured to rotated while the process kit ring is lifted from the carrier by the lift mechanism to align the carrier with respect to the process kit ring. The lift mechanism is further configured to lower the process kit ring back onto the carrier that is aligned with the process kit ring.

20 Claims, 7 Drawing Sheets

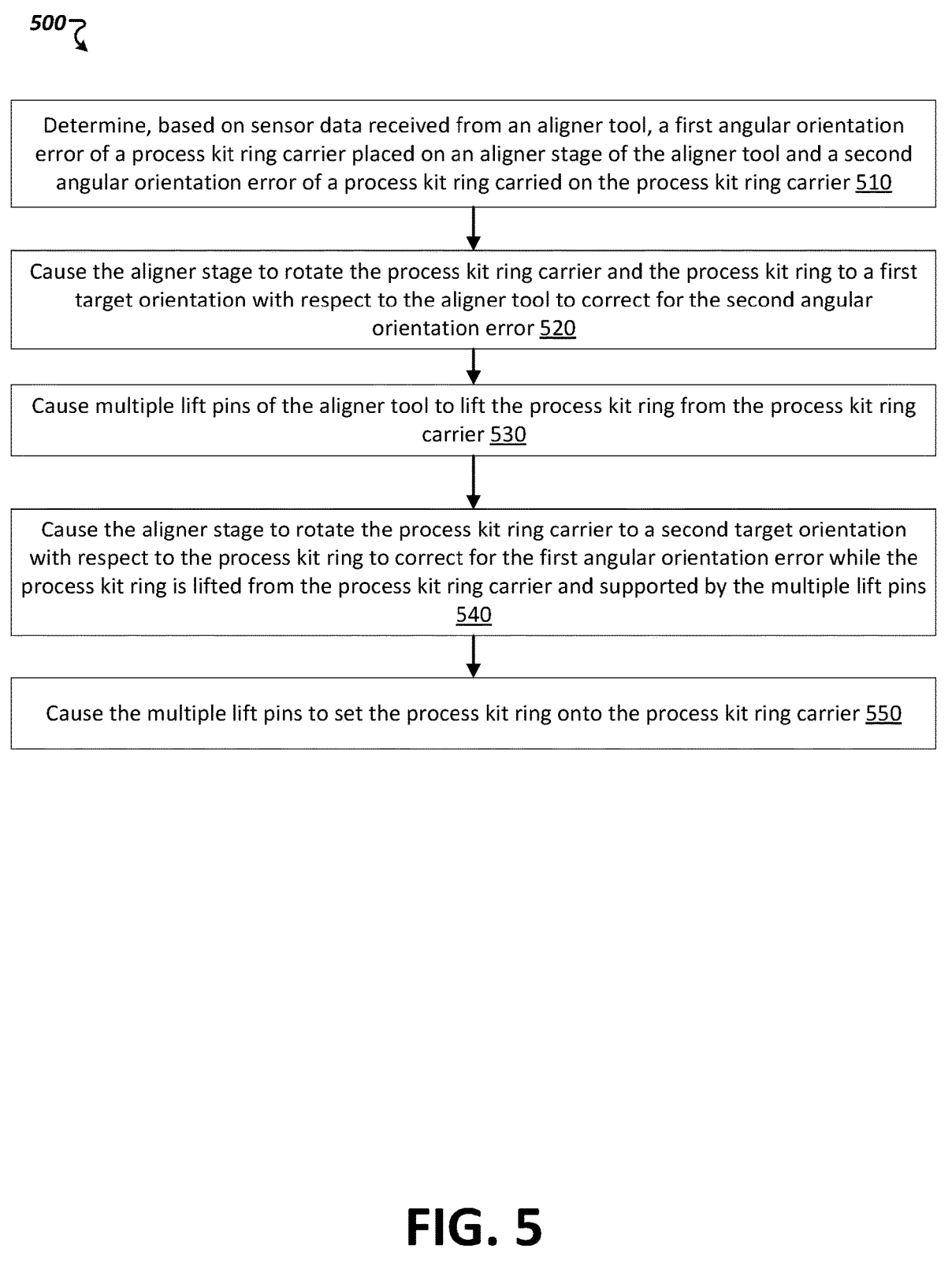

500

Determine, based on sensor data received from an aligner tool, a first angular orientation error of a process kit ring carrier placed on an aligner stage of the aligner tool and a second angular orientation error of a process kit ring carried on the process kit ring carrier 510

↓

Cause the aligner stage to rotate the process kit ring carrier and the process kit ring to a first target orientation with respect to the aligner tool to correct for the second angular orientation error 520

↓

Cause multiple lift pins of the aligner tool to lift the process kit ring from the process kit ring carrier 530

↓

Cause the aligner stage to rotate the process kit ring carrier to a second target orientation with respect to the process kit ring to correct for the first angular orientation error while the process kit ring is lifted from the process kit ring carrier and supported by the multiple lift pins 540

↓

Cause the multiple lift pins to set the process kit ring onto the process kit ring carrier 550

FIG. 5

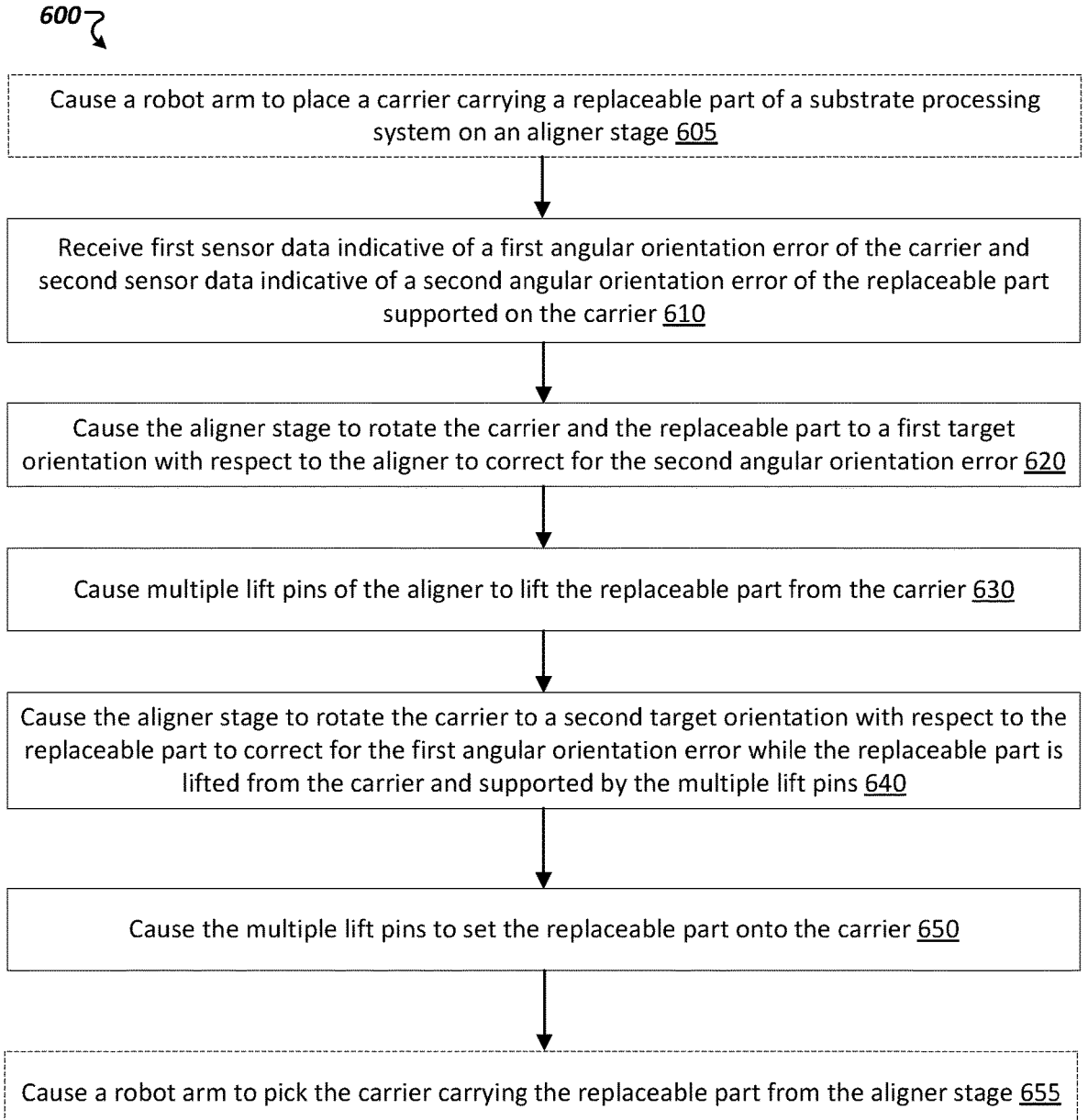

600

Cause a robot arm to place a carrier carrying a replaceable part of a substrate processing system on an aligner stage 605

Receive first sensor data indicative of a first angular orientation error of the carrier and second sensor data indicative of a second angular orientation error of the replaceable part supported on the carrier 610

Cause the aligner stage to rotate the carrier and the replaceable part to a first target orientation with respect to the aligner to correct for the second angular orientation error 620

Cause multiple lift pins of the aligner to lift the replaceable part from the carrier 630

Cause the aligner stage to rotate the carrier to a second target orientation with respect to the replaceable part to correct for the first angular orientation error while the replaceable part is lifted from the carrier and supported by the multiple lift pins 640

Cause the multiple lift pins to set the replaceable part onto the carrier 650

Cause a robot arm to pick the carrier carrying the replaceable part from the aligner stage 655

FIG. 6

ALIGNER STATION WITH LIFTING MECHANISM

TECHNICAL FIELD

Embodiments of the present disclosure relate, in general, to an aligner station of a substrate processing system and methods of operation.

BACKGROUND

An electronics processing system may include one or more robot arms for transporting a substrate from a first station of the electronics processing system to a second station of the electronics processing system. In electronics processing systems, a substrate or an object is to be moved from the first station and placed at a target orientation at the second station. For example, the electronics processing system may include an aligner station and a processing chamber, where a substrate or object may be retrieved from the aligner station by a robot arm for transfer to the processing chamber at a target orientation. The substrate or object may be misaligned when initially placed on the aligner station before transport to the processing chamber.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Some embodiments described herein cover an aligner station. The aligner station includes an aligner stage configured to support a carrier of a process kit ring. The aligner stage is configured to rotate to correct an alignment of the carrier and of the process kit ring supported by the carrier relative to a target orientation. The aligner station further includes a lift mechanism configured to lift the process kit ring from the carrier. The aligner stage is further configured to rotated while the process kit ring is lifted from the carrier by the lift mechanism to align the carrier with respect to the process kit ring. The lift mechanism is further configured to lower the process kit ring back onto the carrier that is aligned with the process kit ring.

Additional or related embodiments described herein cover an aligner. The aligner includes an aligner stage configured to rotate to align a carrier of a replaceable part of a substrate processing system. The aligner further includes multiple lift pins configured to lift the replaceable part from the carrier. The aligner further includes a sensor configured to sense a first angular orientation error of the carrier and a second angular orientation error of the replaceable part supported on the carrier. The aligner further includes a controller. The controller is configured to receive first sensor data indicative of the first angular orientation error and second sensor data indicative of the second angular orientation error. The controller is further configured to cause the aligner stage to rotate the carrier and the replaceable part to a first target orientation with respect to the aligner to correct for the second angular orientation error. The controller is further configured to cause the multiple lift pins to lift the replaceable part from the carrier. The controller is further configured to cause the aligner stage to rotate the carrier to a second target orientation with respect to the replaceable part to correct for the first angular orientation error while the replaceable part is lifted from the carrier and supported by the multiple lift pins. The controller is further configured to cause the multiple lift pins to set the replaceable part onto the carrier.

Further embodiments described herein cover a method. The method includes determining, based on sensor data received from an aligner tool, a first angular orientation error of a process kit ring carrier placed on an aligner stage of the aligner tool and a second angular orientation error of a process kit ring carried on the process kit ring carrier. The method further includes causing the aligner stage to rotate the process kit ring carrier and the process kit ring to a first target orientation with respect to the aligner tool to correct for the second angular orientation error. The method further includes causing multiple lift pins of the aligner tool to lift the process kit ring from the process kit ring carrier. The method further includes causing the aligner stage to rotate the process kit ring carrier to a second target orientation with respect to the process kit ring to correct for the first angular orientation error while the process kit ring is lifted from the process kit ring carrier and supported by the multiple lift pins. The method further includes causing the multiple lift pins to set the process kit ring onto the process kit ring carrier.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 5 is a flow chart of a method for operation of an aligner station of a substrate processing system, according to aspects of the present disclosure.

FIG. 6 is a flow chart of a method for operation of an aligner station of a substrate processing system, according to aspects of the present disclosure.

DETAILED DESCRIPTION OF EMBODIMENTS

Figure 1:
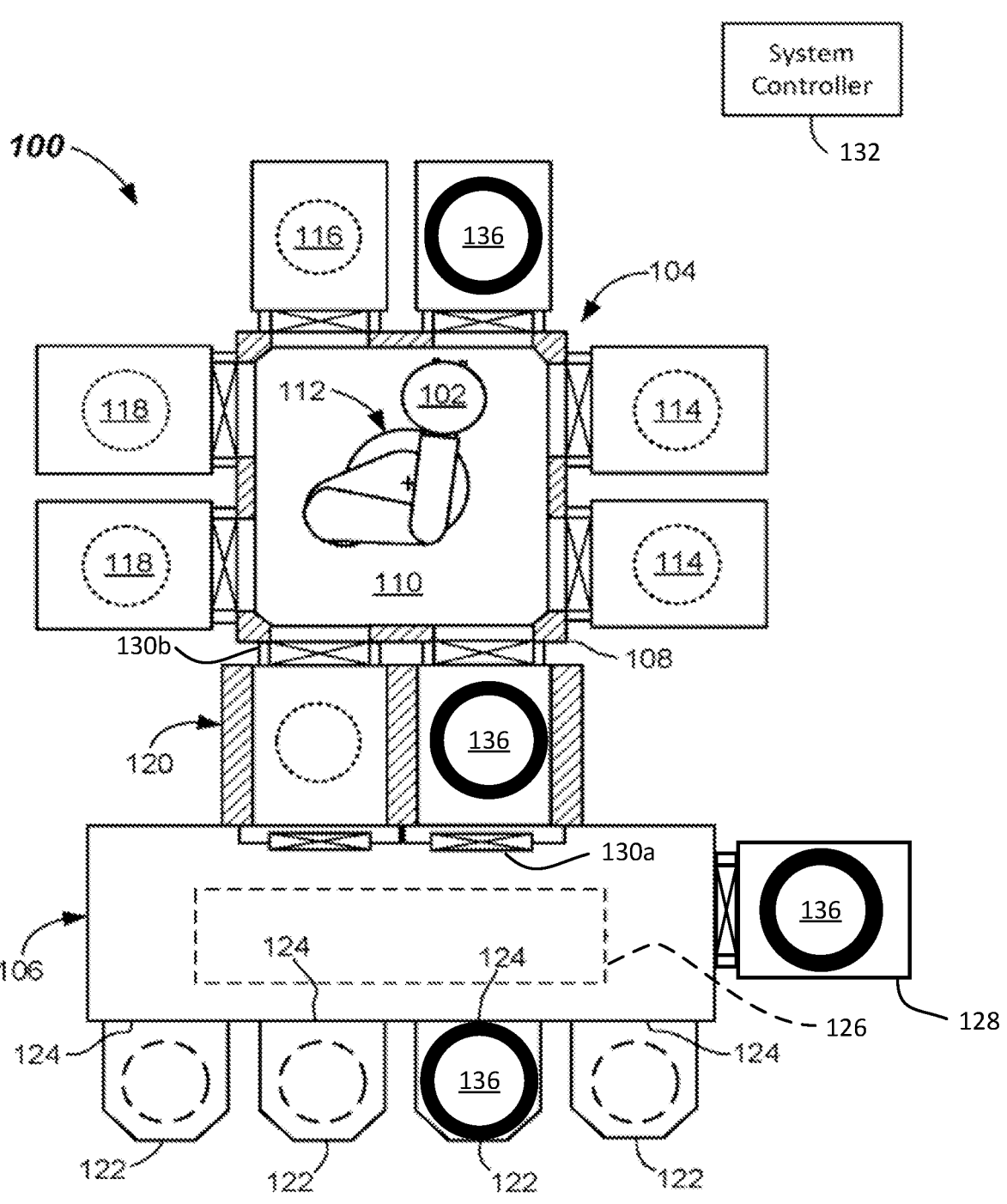
FIG. 1 is a top schematic view of an example electronic processing system, according to aspects of the present disclosure.

Embodiments described herein are related to an aligner station for a substrate processing system and methods of operation thereof. In some embodiments, the aligner station includes a lifting mechanism (e.g., lift pins, lift hoop, etc.) for lifting an object (e.g., such as a replaceable part for the substrate processing system, a process kit ring, etc.) from a carrier so that the carrier and the object can be independently aligned in separate alignment operations.

During transportation, process kit rings may be disposed on carriers that aid in carrying and supporting the process kit rings. A process kit ring may sit on a carrier for transport to and within a substrate processing system. The carrier may include one or more features to properly position the process kit ring on the carrier. For example, the carrier may include one or more fingers that extend beyond the edges of the process kit ring to maintain the planar alignment of the process kit ring (e.g., align the process kit ring in the YX plane). In some instances, the carrier may further include one or more anti-rotation features to prevent the process kit ring from rotating on the carrier. The anti-rotation features may interact with a registration feature (e.g., such as a flat, etc.) on the process kit ring. Because the process kit ring is to be precisely placed in a processing chamber of the substrate processing system, it is often a priority to maintain careful alignment of the process kit ring.

Process kit rings may be transported to a substrate processing system in an enclosure (e.g., a front-opening unified pod (FOUP)). Inside the enclosure, the process kit rings are supported by the carriers. For example, a carrier may sit on a shelf within the enclosure and a process kit ring may sit on the carrier. Enclosures carrying process kit rings may be transported by an overhead transport system. During transport, the process kit rings and their carriers may be jostled, causing the process kit rings to vibrate, shake, move, etc. This movement can cause a process kit ring to rotate with respect to its carrier and become locked (e.g., jammed, etc.) on the carrier. For example, the process kit ring may be jostled such that the process kit ring rotates on the carrier and the flat of the process kit ring becomes jammed against the anti-rotation feature of the carrier. Once a process kit ring is locked on the carrier, it can be difficult to remove the process kit ring from the carrier. Difficulties removing a process kit ring from a carrier can be especially troublesome inside a processing chamber where the process kit ring is to be removed from the carrier for placement in the chamber. Such difficulties can lead to excessive equipment downtime.

One solution for mitigating the risk of a process kit ring becoming stuck on a carrier is to remove the anti-rotation feature(s) from the carrier. In this manner, the process kit ring can vibrate, jostle, rotate, etc. inside an enclosure during transport without the flat of the process kit ring becoming locked on a feature of the carrier. However, the process kit ring can rotate and become misaligned with respect to the carrier. In some embodiments, misalignment of a process kit ring with respect to the carrier can lead to issues installing and/or placing the process kit ring in a processing chamber. A device for aligning the process kit ring with respect to the carrier would allow for the use of a carrier without anti-rotation features that may cause the ill effects described herein above.

In some embodiments, an aligner station includes an aligner stage that can support a carrier of a process kit ring. The aligner stage may be rotatable with respect to a body of the aligner station so that a carrier placed on the aligner stage in a first angular position (e.g., orientation) can be rotated to a second angular position. In some embodiments, the aligner stage is configured to rotate to correct an alignment (e.g., a misalignment) of the carrier and of the process kit ring supported by the carrier. The aligner may be capable of aligning the carrier and the process kit ring to a target orientation. The target orientation may correspond to an orientation for placing the process kit ring in a processing chamber and/or for a robot arm to pick the carrier (e.g., supporting the process kit ring) from the aligner stage.

In some embodiments, the aligner station includes multiple lift pins that are configured to lift the process kit ring from the carrier. In some embodiments, the lift pins are in a retracted state when the carrier (e.g., supporting the process kit ring) is placed on the aligner stage. In some embodiments, the aligner stage rotates to align the process kit ring to the target orientation for the process kit ring while the lift pins are in the retracted state. In some embodiments, the lift pins can be actuated to an extended state to lift the process kit ring from the carrier. In some embodiments, the aligner stage is configured to rotate while the process kit ring is lifted from the carrier by the multiple lift pins to align the carrier with respect to the process kit ring. By lifting the process kit ring off of the carrier, any misalignment between the carrier and the process kit ring can be corrected. In some embodiments, the multiple lift pins are configured to lower the process kit ring back onto the carrier once the carrier is aligned with the process kit ring. By aligning the carrier separately from the process kit ring, the carrier can be oriented for pickup by a robot arm so that damage does not occur to the carrier during the pick and/or during later placement of the process kit ring inside the processing chamber.

Embodiments of the present disclosure provide advantages over conventional solutions described above. By providing an aligner station having lift pins as described herein, a process kit carrier can be used that lacks conventional anti-rotation features. Instead of relying on conventional anti-rotation features on the carrier, any rotation and/or misalignment of a process kit ring can be corrected using an aligner station as described herein. Doing so may decrease wasted and/or broken process kit rings from process kit rings locking onto a carrier as described above. Moreover, system throughput can be increased by decreasing the amount of downtime a substrate processing system experiences during the replacement of process kit rings by ensuring correct alignment of process kit rings and/or carriers and by avoiding complications due to the locking of a process kit ring onto a carrier.

FIG. 1 is a top schematic view of an example electronics processing system 100, according to one aspect of the disclosure. Electronics processing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon.

Electronics processing system 100 may include a process tool 104 and a factory interface 106 coupled to process tool 104. Process tool 104 may include a housing 108 having a transfer chamber 110 therein. Transfer chamber 110 may include one or more processing chambers (also referred to as process chambers) 114, 116, 118 disposed therearound and coupled thereto. Processing chambers 114, 116, 118 may be coupled to transfer chamber 110 through respective ports, such as slit valves or the like.

Processing chambers 114, 116, 118 may be adapted to carry out any number of processes on substrates 102. A same or different substrate process may take place in each processing chamber 114, 116, 118. A substrate process may include atomic layer deposition (ALD), physical vapor deposition (PVD), chemical vapor deposition (CVD), etching, annealing, curing, pre-cleaning, metal or metal oxide removal, or the like. In one example, a PVD process may be performed in one or both of process chambers 114, an etching process may be performed in one or both of process chambers 116, and an annealing process may be performed in one or both of process chambers 118. Other processes may be carried out on substrates therein. Processing chambers 114, 116, 118 may each include a substrate support assembly. The substrate support assembly may be configured to hold a substrate in place while a substrate process is performed.

As described above, an etching process may be performed at one or more processing chambers 114, 116, 118. As such, some processing chambers 114, 116, 118 (such as etch chambers) may include edge rings (also referred to as process kit rings) 136 that are placed at a surface of the substrate support assembly. In some embodiments, the process kit rings may occasionally undergo replacement. While replacement of process kit rings in conventional system includes disassembly of a processing chamber 114, 116, 118 by an operator to replace the process kit ring, electronics processing system 100 may be configured to facilitate replacement of process kit rings without disassembly of a processing chamber 114, 116, 118 by an operator.

In some embodiments, processing chambers 114, 116, 118 may include at least one of a heating or a cooling element displaced therein. A heating element may be configured to increase a temperature of an interior of a processing chamber. A cooling element may be configured to decrease a temperature of the interior of the processing chamber. In some embodiments, the heating element and the cooling element may be the same element.

Transfer chamber 110 may also include a transfer chamber robot 112. Transfer chamber robot 112 may include one or multiple arms where each arm includes one or more end effectors at the end of each arm. The end effector may be configured to handle particular objects, such as wafers. Alternatively, or additionally, the end effector may be configured to handle objects such as process kit rings. In some embodiments, transfer chamber robot 112 may be a selective compliance assembly robot arm (SCARA) robot, such as a 2 link SCARA robot, a 3 link SCARA robot, a 4 link SCARA robot, and so on.

A load lock 120 may also be coupled to housing 108 and transfer chamber 110. Load lock 120 may be configured to interface with, and be coupled to, transfer chamber 110 on one side and factory interface 106. Load lock 120 may have an environmentally-controlled atmosphere that may be changed from a vacuum environment (wherein substrates may be transferred to and from transfer chamber 110) to an at or near atmospheric-pressure inert-gas environment (wherein substrates may be transferred to and from factory interface 106) in some embodiments. In some embodiments, load lock 120 may be a stacked load lock having a pair of upper interior chambers and a pair of lower interior chambers that are located at different vertical levels (e.g., one above another). In some embodiments, the pair of upper interior chambers may be configured to receive processed substrates from transfer chamber 110 for removal from process tool 104, while the pair of lower interior chambers may be configured to receive substrates from factory interface 106 for processing in process tool 104. In some embodiments, load lock 120 may be configured to perform a substrate process (e.g., an etch or a pre-clean) on one or more substrates 102 received therein.

Factory interface 106 may be any suitable enclosure, such as, e.g., an Equipment Front End Module (EFEM). Factory interface 106 may be configured to receive substrates 102 from substrate carriers 122 (e.g., Front Opening Unified Pods (FOUPs)) docked at various load ports 124 of factory interface 106. A factory interface robot 126 (shown dotted) may be configured to transfer substrates 102 between substrate carriers 122 (also referred to as containers) and load lock 120. Factory interface robot 126 may include one or more robot arms and may be or include a SCARA robot. In some embodiments, factory interface robot 126 may have more links and/or more degrees of freedom than transfer chamber robot 112. Factory interface robot 126 may include an end effector on an end of each robot arm. The end effector may be configured to pick up and handle specific objects, such as wafers. Alternatively, or additionally, the end effector may be configured to handle objects such as process kit rings.

Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas) in some embodiments.

In some embodiments, transfer chamber 110, process chambers 114, 116, and 118, and load lock 120 may be maintained at a vacuum level. Electronics processing system 100 may include one or more vacuum ports that are coupled to one or more stations of electronics processing system 100. For example, first vacuum ports 130a may couple factory interface 106 to load locks 120. Second vacuum ports 130b may be coupled to load locks 120 and disposed between load locks 120 and transfer chamber 110.

Electronics processing system 100 may also include a system controller 132. System controller 132 may be and/or include a computing device such as a personal computer, a server computer, a programmable logic controller (PLC), a microcontroller, and so on. System controller 132 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 132 may include a data storage device (e.g., one or more disk drives and/or solid state drives), a main memory, a static memory, a network interface, and/or other components. System controller 132 may execute instructions to perform any one or more of the methodologies and/or embodiments described herein. The instructions may be stored on a computer readable storage medium, which may include the main memory, static memory, secondary storage and/or processing device (during execution of the instructions). System controller 132 may also be configured to permit entry and display of data, operating commands, and the like by a human operator.

FIG. 1 schematically illustrates transfer of an edge ring (or other process kit ring) 136 into a processing chamber 114, 116, 118. According to one aspect of the disclosure, an edge ring 136 is removed from a substrate carrier 122 (e.g., a FOUP) via factory interface robot 126 located in the factory interface 106, or alternatively, is loaded directly into the factory interface 106. An edge ring may be disposed on a carrier as it is transported. Edge rings are discussed herein, but it should be understood that embodiments described with reference to edge rings also apply to other process kit rings and to other replaceable parts or components of processing chambers other than process kit rings. In some embodiments, system controller 132 may determine a transfer recipe for edge ring 136. The transfer recipe may indicate a transfer path that edge ring 136 is to follow while being transported from substrate carrier 122 to a particular processing chamber 114, 116, 118. For example, the transfer recipe may indicate that edge ring 136 is to be moved from aligner station 128 to a particular load lock 120 to processing chamber 116.

Electronics processing system 100 may include an aligner station 128. Aligner station 128 may be housed in factory interface 106. Alternatively, aligner station 128 may be coupled to factory interface 106. Aligner station 128 may be configured to align edge ring 136 to achieve a target orientation of edge ring 136 at a processing chamber 114, 116, or 118. Aligner station 128 may rotate edge ring 136 in a positive or negative yaw-axis direction (e.g., clockwise or counterclockwise) to achieve a target orientation of edge ring 136 at aligner station 128. In some embodiments, aligner station 128 may translate edge ring 136 in a positive or negative x-axis and/or y-axis direction to align the edge ring 136 at aligner station 128. In some embodiments, aligner station 128 may rotate a carrier (e.g., carrying edge ring 136) in a positive or negative yaw-axis direction to achieve the target orientation. In some embodiments, aligner station 128 includes a lift mechanism to lift the edge ring 136 from the carrier for rotation of the carrier independent of the edge ring 136.

The target orientation of edge ring 136 at aligner station 128 may nominally correspond with a target orientation of edge ring 136 at processing chamber 114, 116, or 118. For example, edge ring 136 may include a flat that is to be aligned with a corresponding flat in a substrate support assembly around which the edge ring 136 is to be placed. Failure to accurately place the edge ring 136 at the target orientation in the processing chamber may result in non-uniformities in generated plasma during processing, in uneven wear of the edge ring 136, and/or other problems.

While not shown for clarity in FIG. 1, transfer of edge ring 136 may occur while edge ring 136 is positioned on a carrier or adapter, and the end effectors of the robots may pick up and place the carrier or adapter that holds edge ring 136. This may enable an end effector that is configured for handling of wafers to be used to also handle edge ring 136.

Figure 2B:
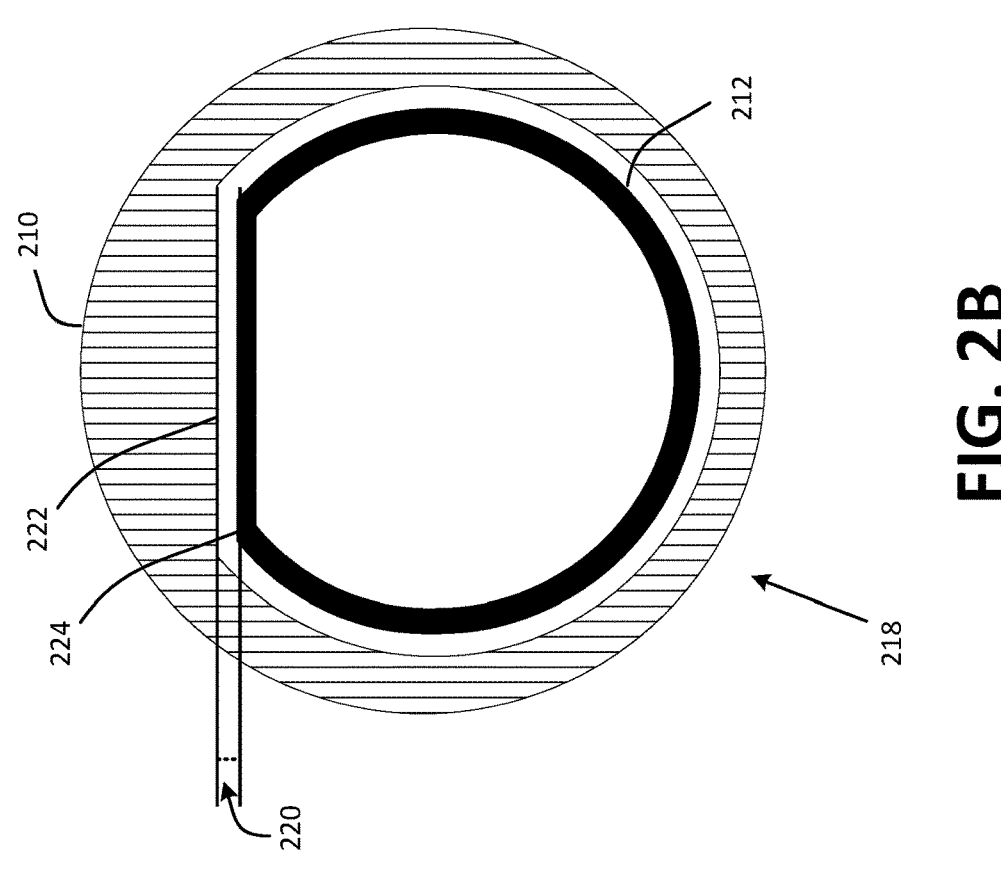
FIGS. 2A and 2B illustrate an example first orientation and an example target orientation of an object at a processing chamber, according to aspects of the present disclosure.
Figure 2A:
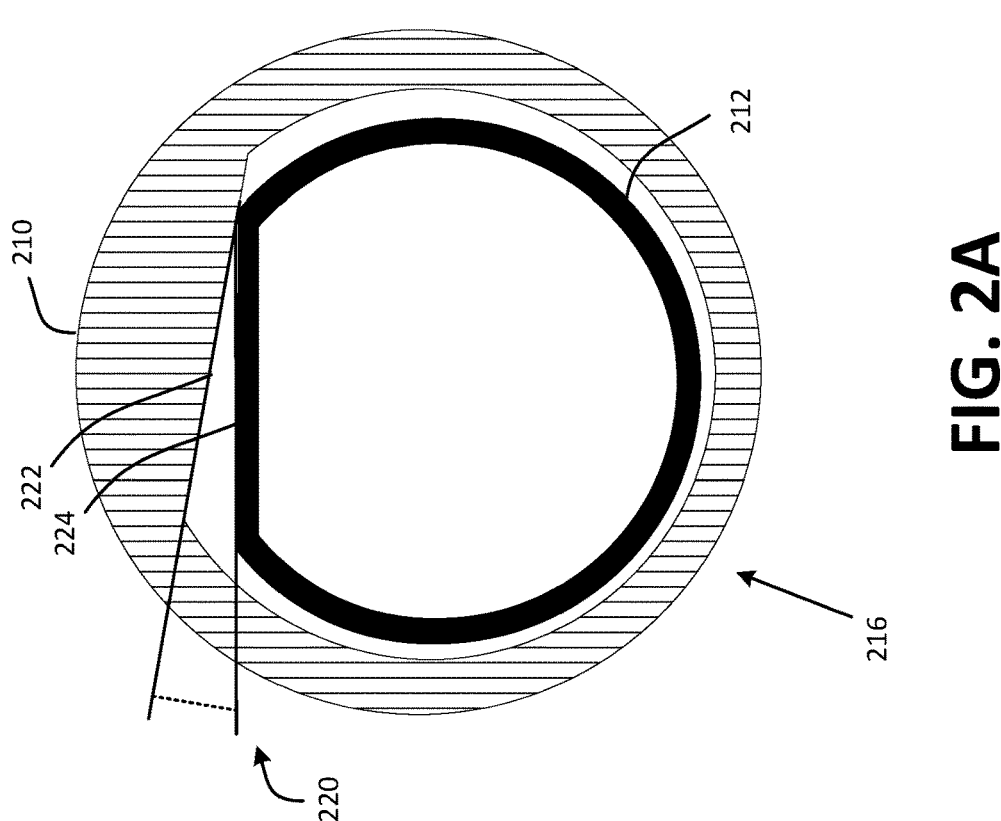

FIGS. 2A and 2B illustrate an example first orientation 216 and an example target orientation 218 of an edge ring 210 at a processing chamber, according to aspects of the present disclosure. The processing chamber may correspond to at least one of processing chamber 114, 116, or 118 of electronics processing system 100 illustrated in FIG. 1. In some embodiments, the processing chamber may include a substrate support assembly 212 configured to support a substrate during a substrate process. Edge ring 210 may be configured for placement around the substrate support assembly 212. As discussed previously, edge ring 210 may be placed by a transfer chamber robot (not shown) at a first orientation 216 at substrate support assembly 212. In some embodiments, first orientation 216 may include an orientation error 220. Orientation error 220 may indicate a difference between an angle of a flat 222 of edge ring 210, relative to an angle of a flat 224 of the substrate support assembly 212. In embodiments, flat 222 is configured to mate with flat 224.

As discussed above, orientation error 220 may be determined based on an angle formed between flat 222 and flat 224. In some embodiments, target orientation 218 in the processing chamber may not include orientation error 220 (i.e., there is no difference between the angle of flat 222 and the angle of flat 224). In some embodiments, an aligner station is used to align the edge ring 210 prior to the introduction of edge ring 210 into a processing chamber so that the edge ring 210 can be placed on the substrate support assembly 212 without orientation error 220.

Figures 3A, 3B:
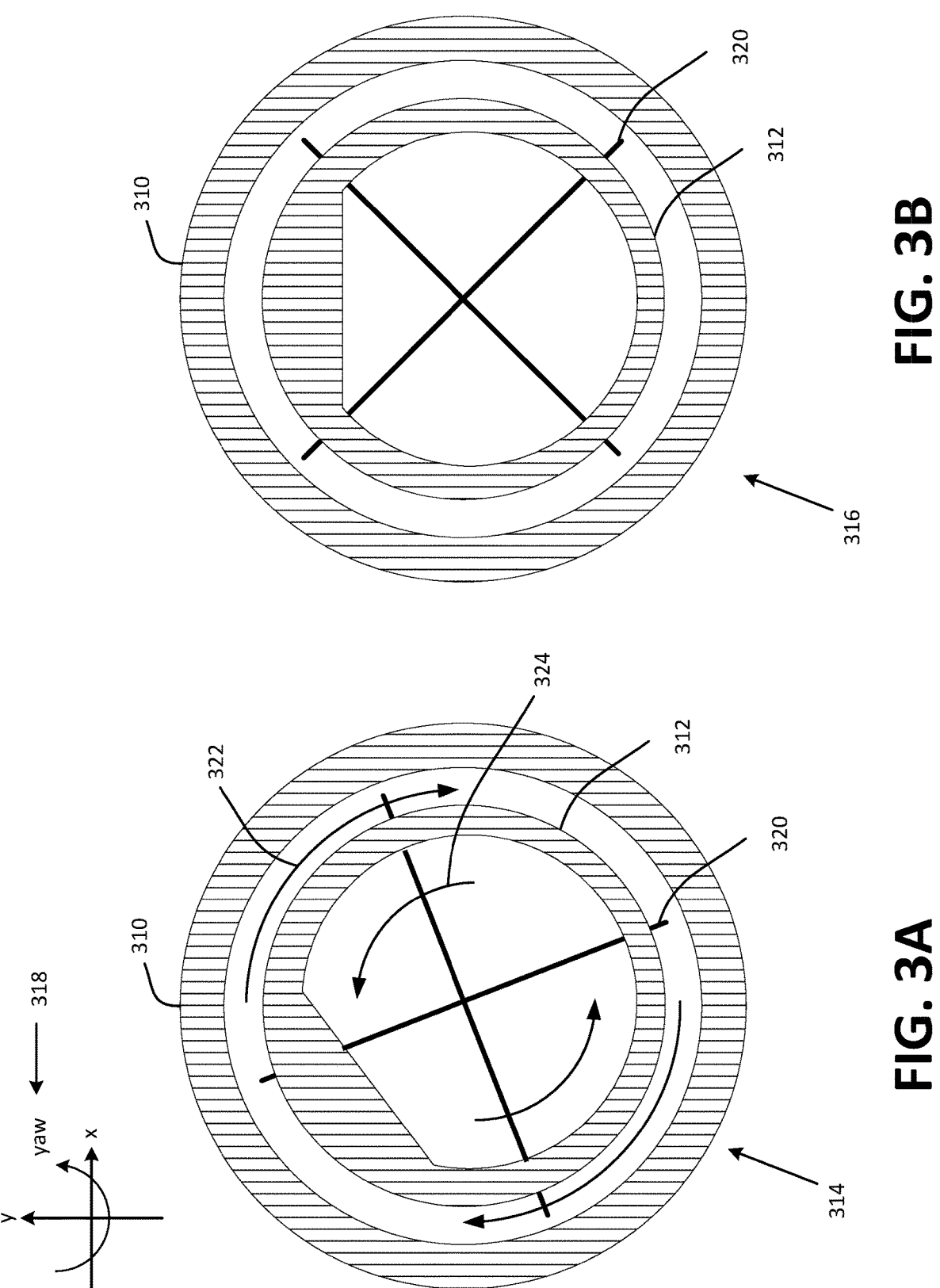
FIGS. 3A and 3B illustrate an example first orientation and an example initial target orientation of an object and a carrier at an aligner of an electronics processing system, according to aspects of the present disclosure.

FIGS. 3A and 3B illustrate an example initial orientation 314 and an example corrected orientation 316 of an edge ring 312 and carrier 320 at an aligner station 310 of an electronics processing system, according to aspects of the present disclosure. In some embodiments, edge ring 312 and carrier 320 are placed at aligner station 310 having an initial orientation 314. In initial orientation 314, the edge ring 312 may be misaligned with respect to the carrier 320. Misalignment of the edge ring 312 may be due to jostling of the edge ring 312 such as during transportation in an enclosure (e.g., a FOUP). Misalignment of the carrier 320 may be due to an error that occurred during placement of the carrier 320. In some embodiments, the aligner station 310 may remove errors in the alignment/orientation of the edge ring 312 and/or carrier 320 by rotating the carrier (e.g., about the yaw-axis 318) 320 and edge ring 312 to orient the edge ring 312 to a target orientation followed by rotating just the carrier 320 to orient the carrier 320 to the target orientation. In some embodiments, rotation of just the carrier 320 occurs while the edge ring 312 is lifted off of the carrier 320 and supported by a lift mechanism of the aligner station 310.

In some embodiments, the target orientation to which the edge ring 312 and/or the carrier 320 are rotated corresponds with the target orientation 316. In some embodiments, aligner 310 may orient edge ring 312 and/or carrier 320 at target orientation 316 based on an alignment recipe stored at a controller, such as system controller 132 described with respect to FIG. 1. In some embodiments, the target orientation 316 corresponds to a single target alignment for picking of the carrier 320 from the aligner 310 by a robot arm (e.g., by a robot end effector, etc.) and for placement of the edge ring 312 in a process chamber. For example, in the target orientation 316, a robot arm end effector may be able to pick up the carrier 320 supporting the edge ring 312 without damaging the edge ring 312 or the carrier 320.

Figures 4A, 4B:
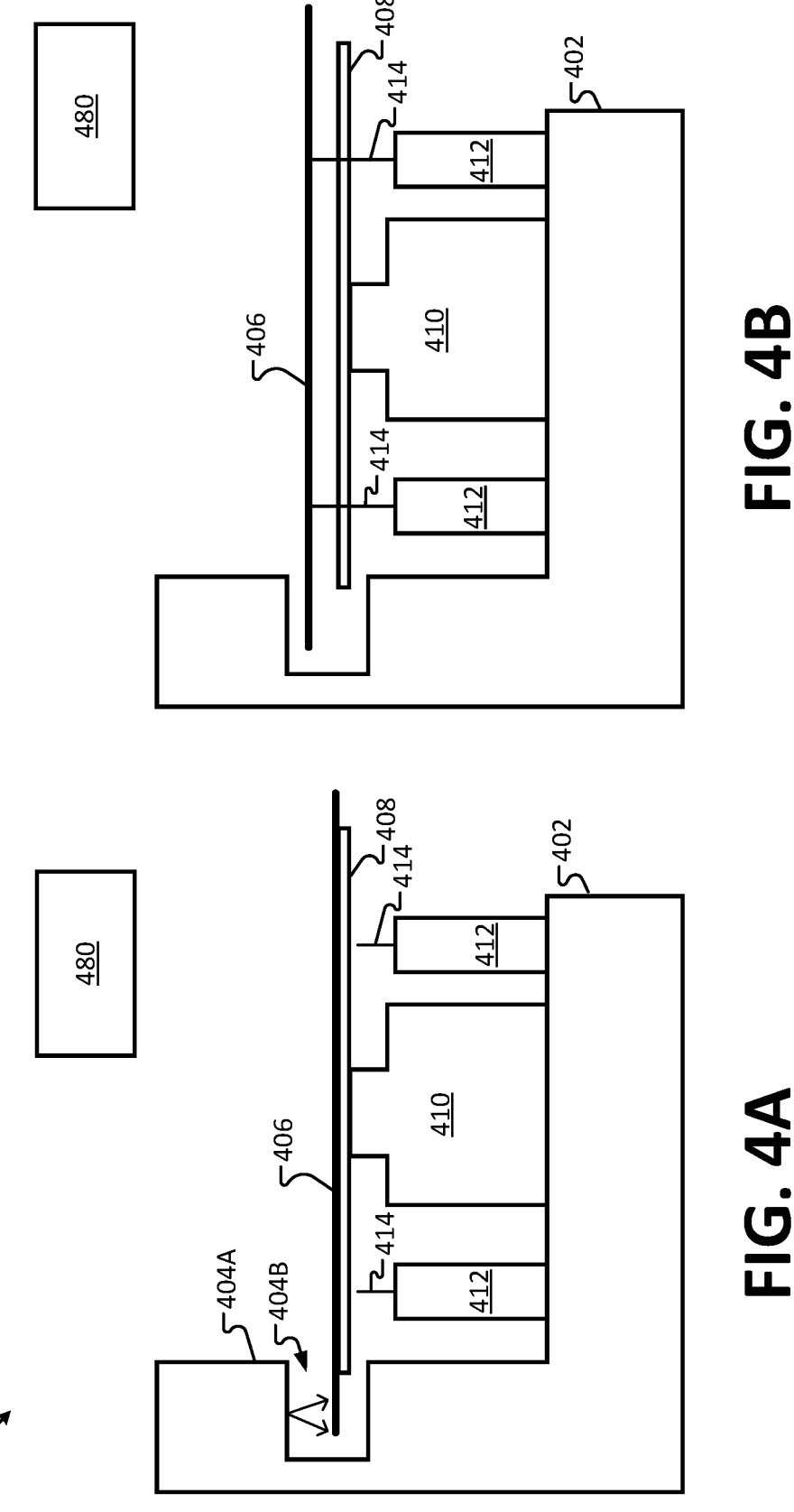
FIGS. 4A and 4B illustrate an example aligner station, according to aspects of the present disclosure.

FIGS. 4A and 4B illustrate an example aligner station 400, according to aspects of the present disclosure. In some embodiments, aligner station 400 corresponds to aligner station 128 of FIG. 1.

In some embodiments, aligner station 400 includes a body 402 and a stage 410. The stage 410 may be rotatable with respect to the body 402. In some embodiments, the stage 410 is configured to support a carrier 408 carrying a process kit ring 406. In some embodiments, the aligner station 400 includes a lift mechanism to lift and support process kit ring 406. In some embodiments, multiple lift pin actuators 412 are coupled to the body 402. Lift pins 414 may extend from the lift pin actuators 412. In some embodiments, lift pins 414 are actuatable between a retracted state (e.g., shown in FIG. 4A) and an extended state (e.g., shown in FIG. 4B). In some embodiments, the lift pins 414 and/or the lift pin actuators 412 make up the lift mechanism.

In some embodiments, a robot arm (e.g., a robot end effector, etc.) may place the carrier 408 carrying the process kit ring 406 onto the stage 410. The carrier 408 and/or the process kit ring 406 may each have an orientation error. For example, the carrier 408 and/or the process kit ring 406 may have an orientation different from a target orientation when placed on the stage 410. The target orientation may be a single orientation (e.g., for both the carrier 408 and the process kit ring 406) for picking of the carrier 408 from the stage 410 (e.g., by a robot arm) and for placement of the process kit ring 406 in a process chamber. In some embodiments, the carrier 408 may be safely picked from the stage (e.g., without risk of damage) when in the target orientation. In some embodiments, the process kit ring 406 may be transported for successful placement in the process chamber when in the target orientation.

In some embodiments, a sensor 404A emits a beam 404B (e.g., a laser beam, etc.) to measure the position, alignment, and/or orientation of the process kit ring 406 and/or the carrier 408. For example, the sensor 404A can detect (e.g., using the beam 404B) the angular orientation of the carrier 408 and/or the angular orientation of the process kit ring 406. In some embodiments, the carrier 408 and the process kit ring 406 are rotated (e.g., by the stage 410) so that the entire periphery of the carrier 408 and the entire periphery of the process kit ring 406 are exposed to the sensor beam 404B. The sensor 404A may detect one or more features of the carrier 408 (e.g., fingers that hold the process kit ring, etc.) and/or one or more features of the process kit ring 406 (e.g., registration features such as a flat, etc.). The sensor 404A may sense an orientation error of the carrier 408 and/or an orientation error of the process kit ring 406. In some embodiments, the location of the feature(s) of the carrier 408 are associated with the orientation error of the carrier 408 and the location of the feature(s) of the process kit ring 406 are associated with the orientation error of the process kit ring 406. The orientation errors may be with respect to a target orientation of the carrier 408 and/or of the process kit ring 406.

In some embodiments, a controller 480 receives sensor data from sensor 404A. Based on the sensor data, the controller 480 may determine the angular orientation of the process kit ring 406 and the angular orientation of the carrier 408. Based on the determined orientation of the process kit ring 406, the controller 480 can determine the orientation error of the process kit ring 406. Based on the orientation error of the process kit ring 406, the controller 480 can determine a corrective action that is to correct for the orientation error of the process kit ring 406. The corrective action may be to orient the process kit ring 406 to a target orientation. In an example, the controller 480 may determine the magnitude and direction that the process kit ring 406 is to be rotated to orient the process kit ring 406 to the target orientation. Based on the determined orientation of the carrier 408, the controller 480 can determine the orientation error of the carrier 408. Based on the orientation error of the carrier 408, the controller 480 can determine a corrective action that is to correct for the orientation error of the carrier 408. The corrective action may be to orient the carrier to a target orientation. In an example, the controller 480 may determine the magnitude and direction that the carrier 408 is to be rotated to orient the carrier 408 to the target orientation. In some embodiments, the target orientation corresponds to corrected orientation 316 shown in FIG. 3B.

After determining corrective action(s) to correct for the orientation errors of the carrier 408 and/or of the process kit ring 406 (e.g., to orient the carrier 408 and/or the process kit ring 406 to the target orientation, etc.), the controller 480 may cause the stage 410 to rotate the carrier 408 and the process kit ring 406 (e.g., supported on the carrier 408) to correct for the orientation error of the process kit ring 406 (e.g., to orient the process kit ring 406 to the target orientation). For example, the controller 480 may cause the stage 410 to rotate clockwise or counterclockwise a determined amount so that the process kit ring 406 is oriented to the target orientation.

After aligning the process kit ring 406 to the target orientation (e.g., correcting for the orientation error, etc.), the carrier 408 may still have an orientation error. In some embodiments, the controller 480 causes the actuators 412 to extend the lift pins 414 to lift the process kit ring 406 off of the carrier 408. The lift pins 414 may lift the process kit ring 406 off of the carrier 408 so that the orientation of the process kit ring 406 is not affected. While the process kit ring 406 is supported by the lift pins 414, the controller 480 may cause the stage 410 to rotate the carrier 408 to correct for the orientation error of the carrier 408 (e.g., to orient the carrier 408 to the target orientation). For example, the controller 480 may cause the stage 410 to rotate clockwise or counterclockwise a determined amount so that the carrier 408 is oriented to the target orientation. In some embodiments, in the target orientation, the carrier 408 is aligned with the process kit ring 406. After aligning the carrier 408 to the target orientation (e.g., correcting for the orientation error, etc.), the controller 480 may cause the actuators 412 to retract the lift pins 414 to lower the process kit ring 406 back onto the carrier 408. In some embodiments, the lift pins 414 are electronically actuated and/or pneumatically actuated. For example, the actuators 412 may be electronic actuators or may be pneumatic actuators.

After the carrier 408 and/or the process kit ring 406 are oriented to the target orientation, a robot arm may be caused to pick the carrier 408 carrying the process kit ring 406 from the stage 410. The carrier 408 carrying the process kit ring 406 may be transported to a process chamber for placement of the process kit ring 406 in the process chamber.

FIG. 5 is a flow chart of a method 500 for operation of an aligner station of a substrate processing system, according to aspects of the present disclosure. Method 500 may be performed by processing logic that may include hardware (circuitry, dedicated logic, etc.), software (such as is run on a general purpose computer system or a dedicated machine), firmware, or some combination thereof. Method 500 may be performed by a computing device, such as system controller 132 of FIG. 1 or controller 480 of FIGS. 4A and 4B.

For simplicity of explanation, method 500 is depicted and described as a series of acts. However, acts in accordance with this disclosure can occur in various orders and/or concurrently, and with other acts not presented and described herein. Furthermore, not all illustrated acts may be performed to implement method 500 in accordance with the disclosed subject matter. In addition, those skilled in the art will understand and appreciate that method 500 could alternatively be represented as a series of interrelated states via a state diagram or events.

At block 510, processing logic determines, based on sensor data received from an aligner tool (e.g., aligner station 400), a first angular orientation error of a process kit ring carrier placed on an aligner stage of the aligner tool. Processing logic further determines, based on the sensor data, a second angular orientation error of a process kit ring carried on the process kit ring carrier. In some embodiments, the first angular orientation error of the process kit ring carrier with respect to a target orientation (e.g., orientation 316) and the second angular orientation error of the process kit ring is with respect to the target orientation.

At block 520, processing logic causes the aligner stage to rotate the process kit ring carrier and the process kit ring to a first target orientation with respect to the aligner tool to correct for the second angular orientation error. In some embodiments, the aligner stage is caused to rotate the carrier and the process kit ring to rotate the process kit ring to a corresponding target orientation. The target orientation of the process kit ring may be an orientation with respect to the aligner. In some embodiments, the target orientation of the process kit ring corresponds to an orientation in which the process kit ring can be transported to a process chamber for successful placement in the process chamber.

At block 530, processing logic causes multiple lift pins of the aligner tool to lift the process kit ring from the process kit ring carrier. In some embodiments, the multiple lift pins are caused to actuate from a retracted position to an extended position to lift the process kit ring. While the multiple lift pins are in the extended position, the process kit ring may be raised off of the carrier and may be supported by the lift pins. The multiple lift pins may be caused to lift the process kit ring off of the carrier so that the orientation of the process kit ring is preserved.

At block 540, processing logic causes the aligner stage to rotate the process kit ring carrier to a second target orientation with respect to the process kit ring to correct for the first angular orientation error. The aligner stage may be caused to rotate while the process kit ring is lifted from the process kit ring carrier and supported by the multiple lift pins. Lifting the process kit ring from the carrier may be performed so that the carrier can be aligned with respect to the process kit ring without affecting the orientation of the process kit ring.

At block 550, processing logic causes the multiple lift pins to set the process kit ring onto the process kit ring carrier. The carrier and the process kit ring may be aligned with one another and may be oriented to the target orientation.

FIG. 6 is a flow chart of a method 600 for operation of an aligner station of a substrate processing system, according to aspects of the present disclosure. Method 600 may be performed by processing logic that may include hardware (circuitry, dedicated logic, etc.), software (such as is run on a general purpose computer system or a dedicated machine), firmware, or some combination thereof. Method 600 may be performed by a computing device, such as system controller 132 of FIG. 1 or controller 480 of FIGS. 4A and 4B.

For simplicity of explanation, method 600 is depicted and described as a series of acts. However, acts in accordance with this disclosure can occur in various orders and/or concurrently, and with other acts not presented and described herein. Furthermore, not all illustrated acts may be performed to implement method 600 in accordance with the disclosed subject matter. In addition, those skilled in the art will understand and appreciate that method 600 could alternatively be represented as a series of interrelated states via a state diagram or events.

At block 605, processing logic causes a robot arm to place a carrier carrying a replaceable part of a substrate processing system on an aligner stage. In some embodiments, the replaceable part is a process kit ring. The carrier and the replaceable part may each have an orientation error (e.g., with respect to a target orientation) when initially placed on the aligner stage.

At block 610, processing logic receives first sensor data indicative of a first angular orientation error of the carrier and second sensor data indicative of a second angular orientation error of the replaceable part supported on the carrier. The sensor data may be generated by a sensor that is to sense the angular orientation of the carrier and the angular orientation of the replaceable part.

At block 620, processing logic causes the aligner stage to rotate the carrier and the replaceable part to a first target orientation with respect to the aligner to correct for the second angular orientation error. In some embodiments, the aligner stage is caused to rotate the carrier and the replaceable part to rotate the replaceable part to a corresponding target orientation.

At block 630, processing logic causes multiple lift pins of the aligner to lift the replaceable part from the carrier.

At block 640, processing logic causes the aligner stage to rotate the carrier to a second target orientation with respect to the replaceable part to correct for the first angular orientation error. The aligner stage may be caused to rotate while the replaceable part is lifted from the carrier and supported by the multiple lift pins.

At block 650, processing logic causes the multiple lift pins to set the replaceable part onto the carrier. The carrier and the replaceable part may be aligned with one another and may be oriented to the target orientation.

At block 655, processing logic causes a robot arm to pick the carrier carrying the replaceable part from the aligner stage. The carrier may be oriented so that the robot arm can pick the carrier from the aligner stage without damaging the carrier. The replaceable part may be oriented so that the replaceable part can be transported to and then successfully placed in a process chamber of an associated substrate processing system.

Figure 7:
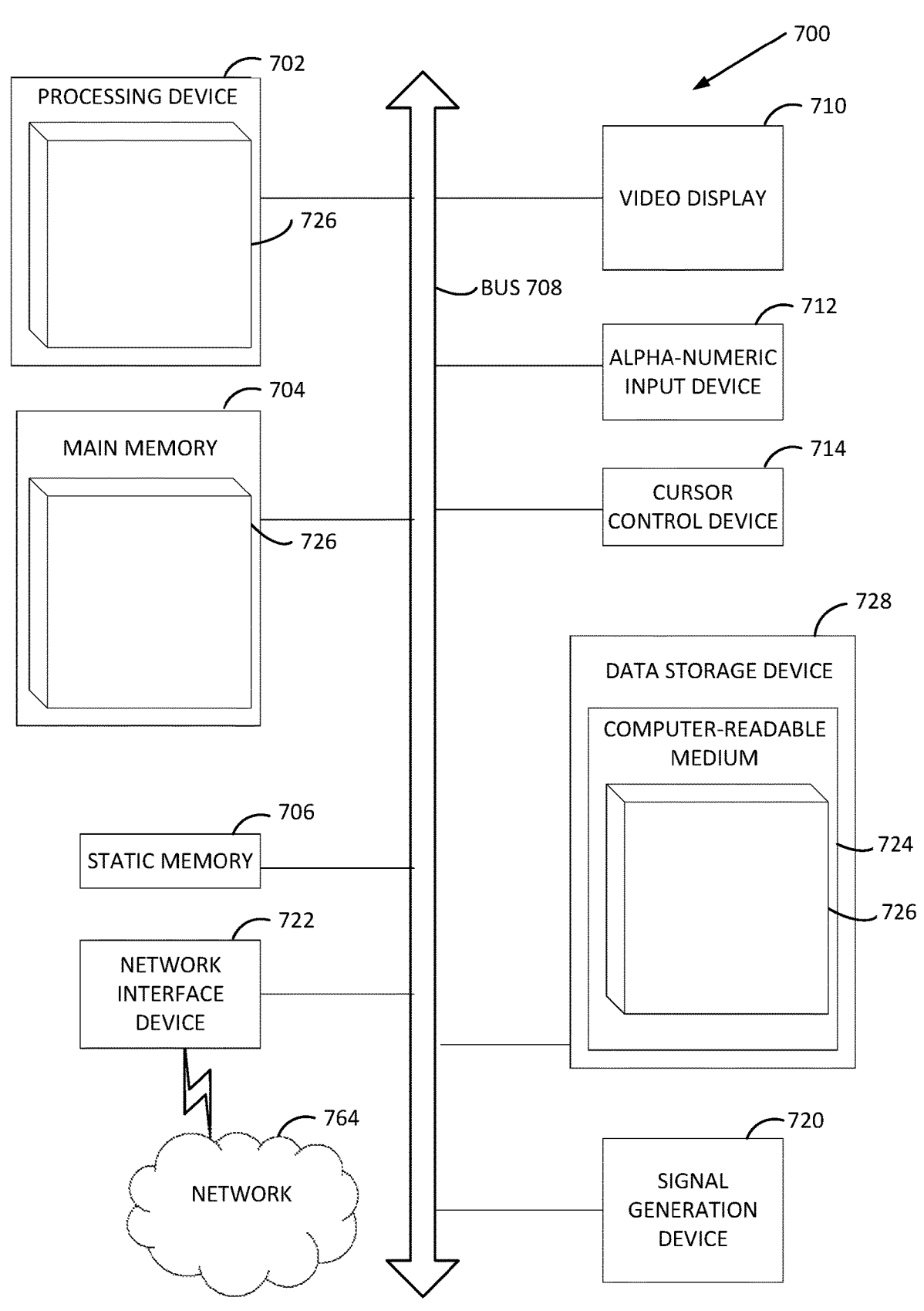
FIG. 7 depicts a diagrammatic representation of a machine in the example form of a computing device within which a set of instructions, for causing the machine to perform any one or more of the methodologies discussed herein, can be executed.

FIG. 7 depicts a diagrammatic representation of a machine in the example form of a computing device 700 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 700 can correspond to one or more of system controller 132 or controller 480 as described herein.

The example computing device 700 includes a processing device 702, a main memory 704 (e.g., read-only memory (ROM), flash memory, dynamic random access memory (DRAM) such as synchronous DRAM (SDRAM), etc.), a static memory 706 (e.g., flash memory, static random access memory (SRAM), etc.), and a secondary memory (e.g., a data storage device 728), which communicate with each other via a bus 708.

Processing device 702 can represent one or more general-purpose processors such as a microprocessor, central processing unit, or the like. More particularly, the processing device 702 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. Processing device 702 can also be or include a system on a chip (SoC), programmable logic controller (PLC), or other type of processing device. Processing device 702 is configured to execute the processing logic for performing operations discussed herein.

The computing device 700 can further include a network interface device 722 for communicating with a network 764. The computing device 700 also can include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 720 (e.g., a speaker).

The data storage device 728 can include a machine-readable storage medium (or more specifically a non-transitory machine-readable storage medium) 724 on which is stored one or more sets of instructions 726 embodying any one or more of the methodologies or functions described herein. A non-transitory storage medium refers to a storage medium other than a carrier wave. The instructions 726 can also reside, completely or at least partially, within the main memory 704 and/or within the processing device 702 during execution thereof by the computer device 700, the main memory 704 and the processing device 702 also constituting computer-readable storage media.

While the computer-readable storage medium 724 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or"

rather than an exclusive "or." When the term "about" or "approximately" is used herein, this is intended to mean that the nominal value presented is precise within +10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An aligner station, comprising:
an aligner stage configured to support a carrier of a process kit ring, wherein the aligner stage is configured to rotate to correct an alignment of the carrier and of the process kit ring supported by the carrier relative to a target orientation; and
a lift mechanism configured to lift the process kit ring from the carrier;
wherein the aligner stage is further configured rotate while the process kit ring is lifted from the carrier by the lift mechanism to align the carrier with respect to the process kit ring; and
wherein the lift mechanism is further configured to lower the process kit ring back onto the carrier that is aligned with the process kit ring.

2. The aligner station of claim 1, wherein the aligner stage is configured to align the carrier with respect to a registration feature of the process kit ring.

3. The aligner station of claim 1, further comprising:
one or more lift pin actuators coupled to a body of the aligner station, wherein each of the one or more lift pin actuators corresponds to a lift pin of the lift mechanism.

4. The aligner station of claim 3, wherein the one or more lift pin actuators are pneumatically actuated or electronically actuated.

5. The aligner station of claim 1, further comprising:
a sensor configured to sense a first angular orientation of the carrier and a second angular orientation of the process kit ring.

6. The aligner station of claim 5, wherein the sensor is configured to emit a sensor beam to detect one or more features of at least one of the carrier or the process kit ring.

7. The aligner station of claim 5, wherein the first angular orientation is associated with a first angular orientation error of the carrier, wherein the second angular orientation is associated with a second angular orientation error of the process kit ring, and wherein the aligner is configured to align the carrier and the process kit ring to correct the first angular orientation error and the second angular orientation error.

8. The aligner station of claim 1, wherein the aligner stage is configured to align the process kit ring with respect to the aligner station while the process kit ring is disposed on the carrier.

9. An aligner, comprising:
an aligner stage configured to rotate to align a carrier of a replaceable part of a substrate processing system;

multiple lift pins configured to lift the replaceable part from the carrier;

a sensor configured to sense a first angular orientation error of the carrier and a second angular orientation error of the replaceable part supported on the carrier; and a controller, wherein the controller is configured to:

receive first sensor data indicative of the first angular orientation error and second sensor data indicative of the second angular orientation error;

cause the aligner stage to rotate the carrier and the replaceable part to a first target orientation with respect to the aligner to correct for the second angular orientation error;

cause the multiple lift pins to lift the replaceable part from the carrier;

cause the aligner stage to rotate the carrier to a second target orientation with respect to the replaceable part to correct for the first angular orientation error while the replaceable part is lifted from the carrier and supported by the multiple lift pins; and cause the multiple lift pins to set the replaceable part onto the carrier.

10. The aligner of claim 9, wherein the controller is further configured to:

cause a robot arm to place the carrier carrying the replaceable part on the aligner stage, wherein the carrier has the first angular orientation error and the replaceable part has the second angular orientation error when the carrier is placed on the aligner stage.

11. The aligner of claim 9, wherein the controller is further configured to:

cause a robot arm to pick the carrier carrying the replaceable part from the aligner stage, wherein the carrier has the second target orientation and the replaceable part has the first target orientation when the carrier is picked from the aligner stage.

12. The aligner of claim 9, wherein the first angular orientation error is a first orientation error of the carrier with respect to the second target orientation, and wherein the second angular orientation error is a second orientation error of the replaceable part with respect to the first target orientation.

13. The aligner of claim 9, wherein the first target orientation and the second target orientation correspond to a single target alignment for picking of the carrier carrying the replaceable part from the aligner stage by a robot arm and for placement of the replaceable part in a process chamber of the substrate processing system.

14. The aligner of claim 9, wherein the replaceable part comprises a process kit ring.

15. A method, comprising:

determining, based on sensor data received from an aligner tool, a first angular orientation error of a process kit ring carrier placed on an aligner stage of the aligner tool and a second angular orientation error of a process kit ring carried on the process kit ring carrier;

causing the aligner stage to rotate the process kit ring carrier and the process kit ring to a first target orientation with respect to the aligner tool to correct for the second angular orientation error;

causing multiple lift pins of the aligner tool to lift the process kit ring from the process kit ring carrier;

causing the aligner stage to rotate the process kit ring carrier to a second target orientation with respect to the process kit ring to correct for the first angular orientation error while the process kit ring is lifted from the process kit ring carrier and supported by the multiple lift pins; and causing the multiple lift pins to set the process kit ring onto the process kit ring carrier.

16. The method of claim 15, further comprising:

causing a robot arm to place the process kit ring carrier carrying the process kit ring on the aligner stage, wherein the carrier has the first angular orientation error and the process kit ring has the second angular orientation error when the process kit ring carrier is placed on the aligner stage.

17. The method of claim 15, further comprising:

causing a robot arm to pick the carrier carrying the process kit ring from the aligner stage, wherein the carrier has the second target orientation and the process kit ring has the first target orientation when the carrier is picked from the aligner stage.

18. The method of claim 15, wherein the first angular orientation error is a first orientation error of the carrier with respect to the second target orientation, and wherein the second angular orientation error is a second orientation error of the process kit ring with respect to the first target orientation.

19. The method of claim 15, wherein the first target orientation and the second target orientation correspond to a single target alignment for picking of the carrier from the aligner stage by a robot arm and for placement of the process kit ring in a process chamber of an associated substrate processing system.

20. The method of claim 15, further comprising:

receiving, from a sensor of the aligner tool, the sensor data, wherein the sensor data is indicative of the first angular orientation error and the second angular orientation error.

* * * * *